United States Patent
Sohn et al.

(10) Patent No.: US 6,649,520 B1
(45) Date of Patent: Nov. 18, 2003

(54) METHOD OF FORMING FILM FOR REDUCED OHMIC CONTACT RESISTANCE AND TERNARY PHASE LAYER AMORPHOUS DIFFUSION BARRIER

(75) Inventors: Dong Kyun Sohn, Chungcheongbuk-do (KR); Ji Soo Park, Chungcheongbuk-do (KR); Jong Uk Bae, Chungcheongbuk-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/461,767

(22) Filed: Dec. 15, 1999

(30) Foreign Application Priority Data

Jun. 16, 1999 (KR) ........................................ 1999-22580

(51) Int. Cl.[7] .............................................. H01L 21/44
(52) U.S. Cl. ...................... 438/664; 438/649; 438/655; 438/683
(58) Field of Search ................................ 438/630, 649, 438/655, 663, 664, 682, 683

(56) References Cited

U.S. PATENT DOCUMENTS

| 4,926,237 A | * | 5/1990 | Sun et al. .................... 257/764 |
| 5,514,908 A | * | 5/1996 | Liao et al. .................... 257/751 |
| 5,545,592 A | * | 8/1996 | Iacoponi ...................... 438/655 |
| 5,728,625 A | * | 3/1998 | Tung ............................ 438/586 |
| 5,998,873 A | * | 12/1999 | Blair et al. .................. 257/766 |
| 6,171,959 B1 | * | 1/2001 | Nagabushnam ............. 438/683 |
| 6,177,338 B1 | * | 1/2001 | Liaw et al. ................. 438/629 |
| 6,365,511 B1 | * | 4/2002 | Kizilyalli et al. ........... 438/649 |

FOREIGN PATENT DOCUMENTS

| JP | 408045878 A | * | 2/1996 |
| JP | 410056176 A | * | 2/1998 |

* cited by examiner

*Primary Examiner*—Amir Zarabian
*Assistant Examiner*—Jamie L. Brophy
(74) *Attorney, Agent, or Firm*—Birch, Stewart, Kolasch & Birch, LLP

(57) ABSTRACT

A method for manufacturing a semiconductor device can simply form a silicide film for reducing ohmic contact between a metal line and a substrate and a ternary phase thin film as an amorphous diffusion prevention film between a metal line and the silicide film. The method for manufacturing a semiconductor device includes the steps of sequentially forming a first refractory metal and a second refractory metal on a semiconductor substrate, forming a silicide film on an interface between the semiconductor substrate and the first refractory metal, and reacting the semiconductor substrate with the first and second refractory metals on the silicide film to form a ternary phase thin film.

22 Claims, 7 Drawing Sheets

METHOD OF FORMING FILM FOR REDUCED OHMIC CONTACT RESISTANCE AND TERNARY PHASE LAYER AMORPHOUS DIFFUSION BARRIER

BACKGROUND OF THE INVENTION

1. Field of the Invention

The present invention relates to a method for manufacturing a semiconductor device, and more particularly, to a method for manufacturing a semiconductor device which reduces ohmic contact between a metal line and a substrate.

2. Background of the Related Art

A related art method for manufacturing a semiconductor device will be described with reference to FIGS. 1a to 1e.

As shown in FIG. 1a, a chemical vapor deposition (CVD) oxide film 12 is formed on a semiconductor substrate 11. A photoresist 13 is deposited on the CVD oxide film 12 and then patterned by exposure and developing processes to define a contact region.

Subsequently, the CVD oxide film 12 is selectively removed to partially expose a surface of the semiconductor substrate 11 using the patterned photoresist 13 as a mask, so that a contact hole 14 is formed.

As shown in FIG. 1b, the photoresist 13 is removed and then a titanium (Ti) film 15 and a titanium nitride (TiN) film 16 are sequentially formed on an entire surface of the semiconductor substrate 11 including the contact hole 14.

The Ti film 15 is reacted with the semiconductor substrate 11 to form a silicide, which acts as a having low resistance ohmic contact. The TiN film 16 prevents a line layer, formed later in the process, from being diffused into the substrate.

As shown in FIG. 1c, an annealing process is performed in the semiconductor substrate 11 to react silicon (Si) of the semiconductor substrate 11 with Ti of the Ti film 15, so that a silicide film 17 is formed on the interface between the semiconductor substrate 11 and the Ti film 15.

Lit To form a film of C-54 silicide, annealing at temperature of 850° C. or more is required. However, annealing is actually performed at about 700° C. thus forming C-49 silicide. The resistance of C-49 silicide film is roughly 4~5 times higher than C-54 suicide film.

As shown in FIG. 1d, a first metal layer (not shown) is formed on the entire surface of the semiconductor substrate 11. The first metal layer is planarized by etch back process or chemical mechanical polishing (CMP) process to form a plug 18 in the contact hole 14.

When forming the plug 18, the CVD oxide film 12 is used as an etching end point to perform etch back process or CMP process. The Ti film 15 and the TiN film 16 over the CVD oxide film 12 are selectively removed in the etching process.

As shown in FIG. 1e, a second metal layer is formed, on the plug 18 and the CVD oxide film 12, to be electrically connected with the semiconductor substrate 11 through the plug 18. The second metal layer is then selectively removed to form a metal line 19.

However, the related art method for manufacturing a semiconductor device has several problems.

First, because the annealing process is performed below 850° C., the silicide film of high resistance is formed. Thus, it is difficult to minimize the resistance of the silicide layer, i.e., to produce a good ohmic contact.

Second, when compared with the Si, Ti reacts quicker with dopants such as P, As, and B causing dopant loss on the interface between the silicide film and the substrate during the annealing process. This dopant loss results in further increase in resistance, i.e., it degrades the quality of the ohmic contact. Also Ti reacts differently with As, P, and B, resulting in different electrical characteristics in N type and P type substrates.

Third, the silicide film degrades at a temperature of about 750° C. or more. It is difficult to perform annealing process into the silicide film at high temperature due to low thermal stability of the suicide film.

Fourth, since the silicide film is formed unevenly, poor contact occurs.

Finally, the TiN, used as a diffusion prevention film, is a crystal having columnar structure. Thus, it is difficult to effectively prevent the line layer from being diffused into the substrate. Particularly, TiN is not appropriate for prevention or barrier film of a line layer such as Cu, which is quickly diffused.

SUMMARY OF THE INVENTION

Accordingly, the present invention is directed to devices and methods for manufacturing semiconductor device that substantially obviates one or more of the problems due to limitations and disadvantages of the related art.

An object of the present invention is to provide methods for manufacturing a semiconductor device, which simply form a silicide film for reducing a resistance of an ohmic contact between a metal line and a substrate. The method also forms a ternary phase thin film to act as an amorphous diffusion prevention film between a metal line and the silicide film.

Another object of the present invention is to provide a structure for a semiconductor diffusion prevention device. The structure includes a silicide film for reducing a resistance an ohmic contact between a metal line and a substrate. The structure also includes a ternary phase film to act as a diffusion prevention film between a metal line and the silicide film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a semiconductor device according to the present invention includes the steps of sequentially forming a first refractory metal and a second refractory metal on a semiconductor substrate, forming a silicide film on an interface between the semiconductor substrate and the first refractory metal, and reacting the semiconductor substrate with the first and second refractory metals on the silicide film to form a ternary phase thin film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A method for manufacturing a semiconductor device according to the present invention will be described in detail with reference to the accompanying drawings.

FIGS. 2a to 2e are sectional views illustrating a method for manufacturing a semiconductor device according to an embodiment of the present invention.

Figure 1A:
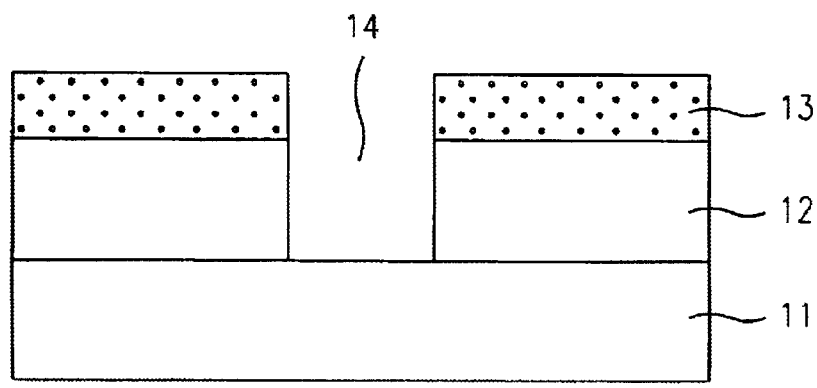
FIGS. 1a to 1e are sectional views illustrating a related art method for manufacturing a semiconductor device.
Figure 1B:
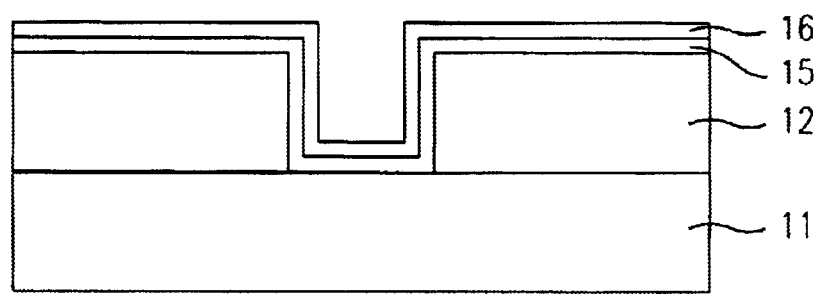
Figure 1C:
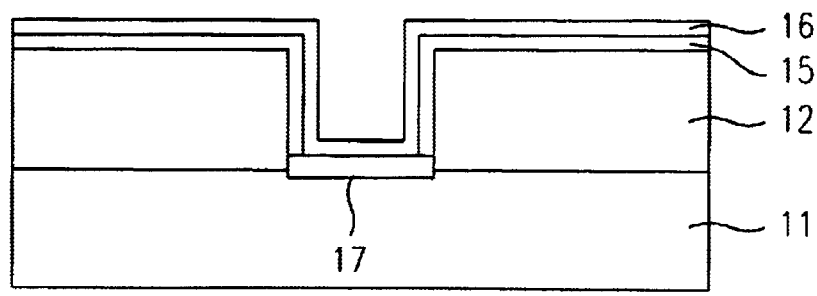
Figure 1D:
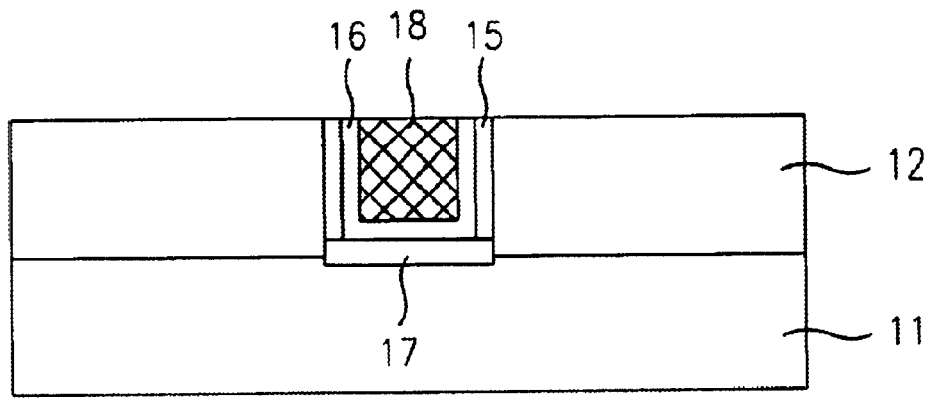
Figure 1E:
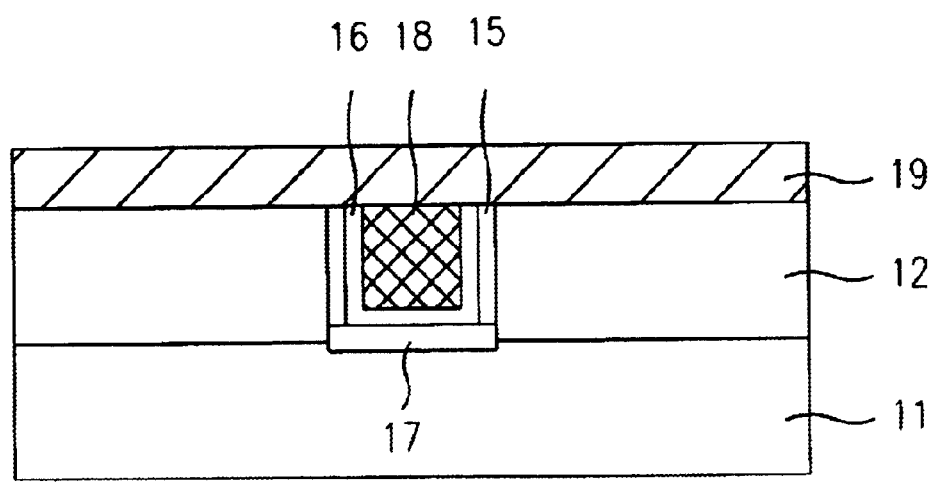
Figure 2A:
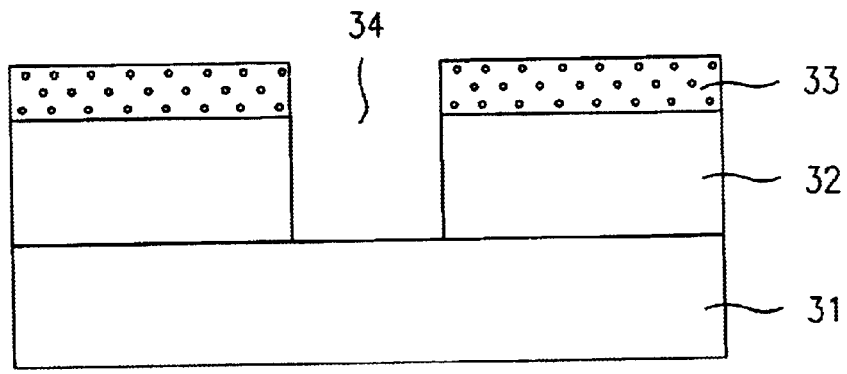
FIGS. 2a to 2e are sectional views illustrating a method for manufacturing a semiconductor device according to an embodiment of the present invention.

As shown in FIG. 2a, a CVD oxide film 32 is formed on a semiconductor substrate 31. A photoresist 33 is deposited on the CVD oxide film 32 and then patterned by exposure and developing processes to define a contact region. At this time, instead of the CVD oxide film 32, an inorganic or organic material such as a nitride film may be used.

Subsequently, the CVD oxide film 32 is selectively removed to partially expose a surface of the semiconductor substrate 31 using the patterned photoresist 33 as a mask, so that a contact hole 34 is formed.

Figure 2B:
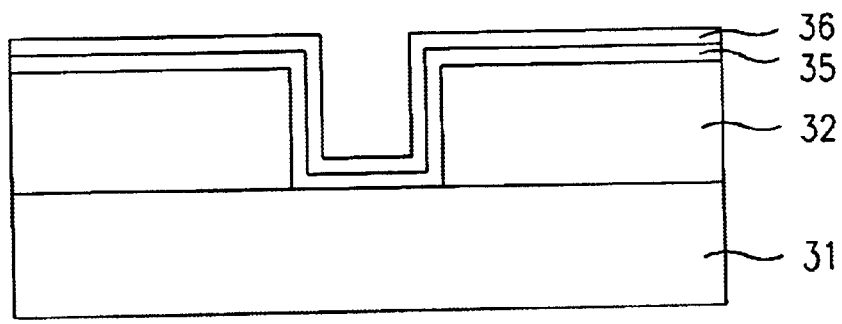

As shown in FIG. 2b, the photoresist 33 is removed and then, e.g., a cobalt (Co) film 35 and a Ti film 36 are sequentially formed on an entire surface of the semiconductor substrate 31 including the contact hole 34. At this time, the Co film 35 and the Ti film 36 are formed by at least one of several processes for forming a thin film, such as CVD process, PVD process, electroplating process, and evaporation process. Instead of the Ti film 36, any one of Tin, Ta, W, V, Cr, Mn, Zr, Mo and Hf may be used.

Figure 2C:
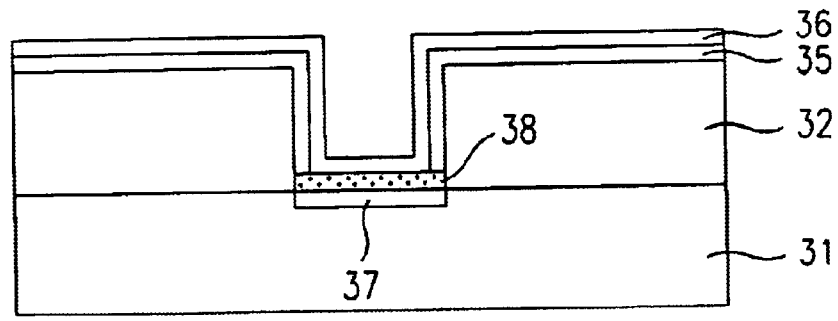

As shown in FIG. 2c, an annealing process is performed in the semiconductor substrate 31 in which the Co film 35 and the Ti film 36 are formed in a nitrogen (N) atmosphere so as to react Co film 35 with the semiconductor substrate 31 at the contact hole 34. Thus, a silicide film 37 of representing a low resistance ohmic contact is formed.

Then an annealing is performed, such as by rapid thermal annealing or furnace annealing.

A ternary phase thin film 38, having amorphous structure by Co—Ti—Si reaction, is formed between the silicide film 37 and the Ti film 36 at a portion where the Si is exposed in the semiconductor substrate 31. The ternary phase thin film 38 acts as a diffusion prevention or barrier film. Also, since the semiconductor substrate 31 is annealed in a nitrogen (N) atmosphere, the Ti film 36 becomes a TiN film.

Figure 2D:
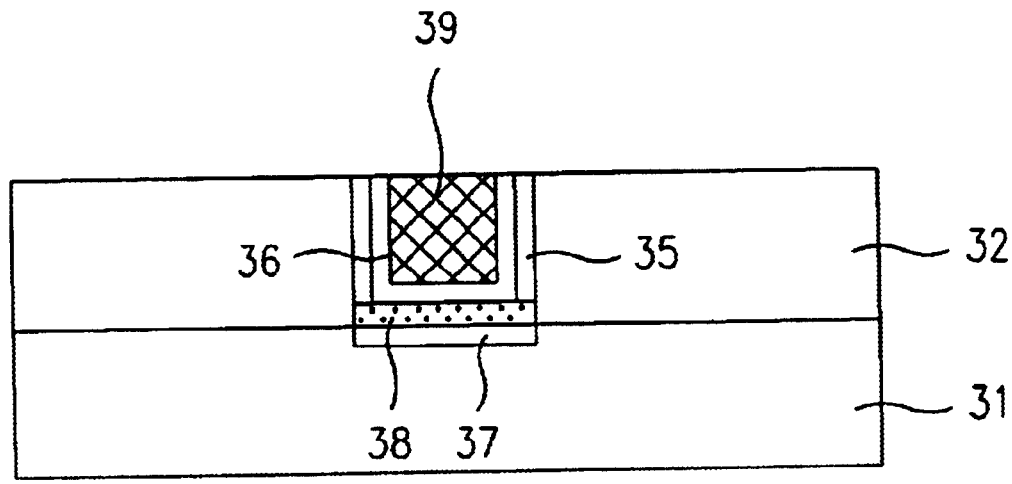

As shown in FIG. 2d, a first metal layer (not shown) is formed on the entire surface of the semiconductor substrate 31. Any one or a combination of W, Al, Cu, WSix, Mo, Cr, Ni, Pd, Pt and Ta may be used as the first metal layer. The first metal layer is formed by at least one of several processes for forming a thin film, such as CVD process, PVD process, electroplating process, and evaporation process. An etch back process or CMP process is then performed on the entire surface of the first metal layer to form a plug 39 in the contact hole 34.

When forming the plug 39, the CVD oxide film 32 is used as an etching end point to perform etch back process or CMP process. The TiN film 36 and the Co film 35 over the CVD oxide film 32 are selectively removed.

Figure 2E:
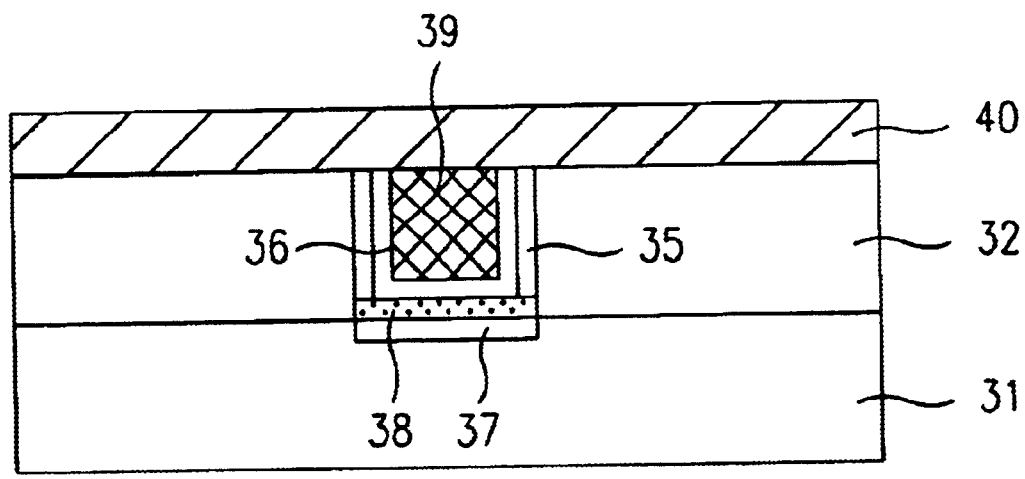

As shown in FIG. 2e, a second metal layer is formed, on the plug 39 and the CVD oxide film 32, to be electrically connected with the semiconductor substrate 31 through the plug 39. The second metal layer is then selectively removed to form a metal line 40. The composition and formation of the second metal layer can be like that of the first metal layer described above.

Figure 3:
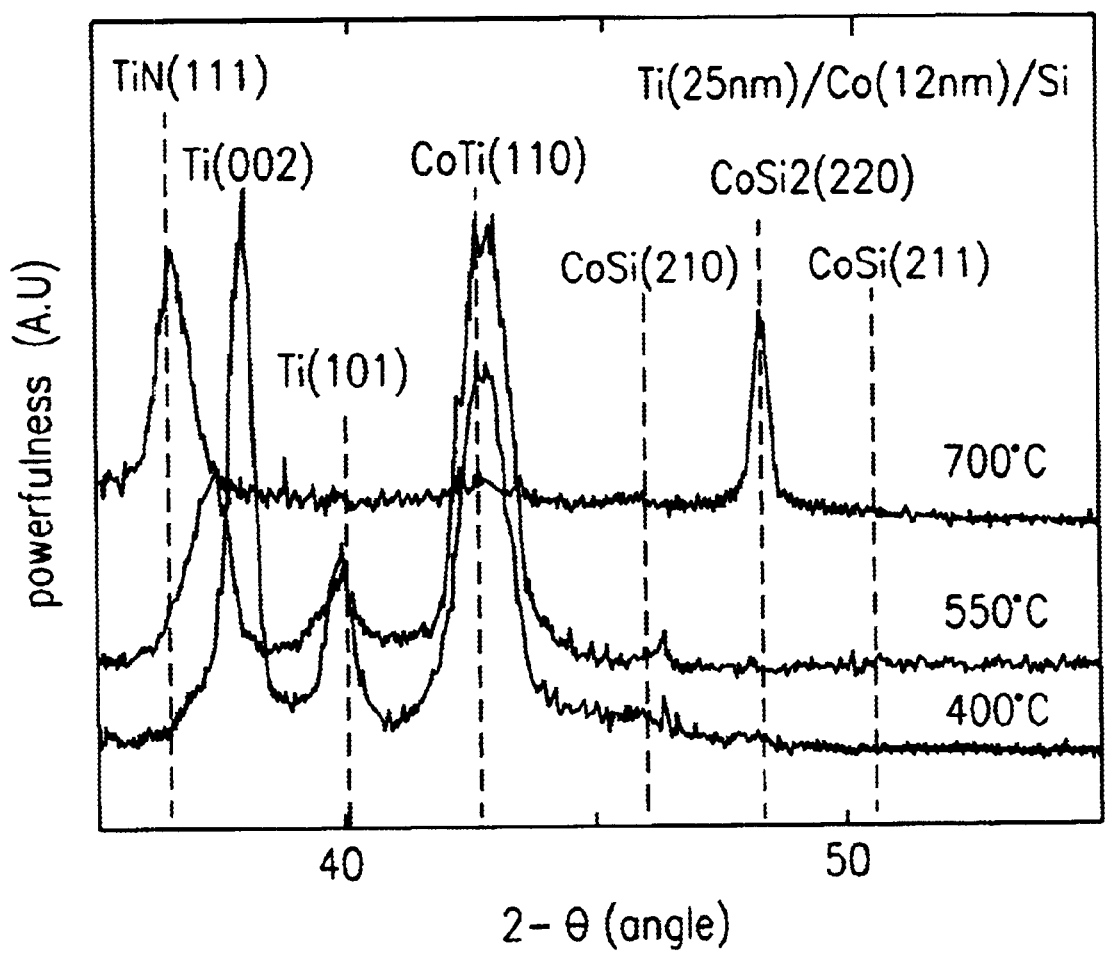
FIG. 3 shows an X-ray diffraction pattern after rapid annealing for 60 seconds at temperatures of 700° C., 550° C., and 400° C. by respectively depositing Ti of 25 nm and Co of 12 nm on a substrate.

FIG. 3 shows an X-ray diffraction pattern after rapid annealing for 60 seconds at temperatures of 700° C., 550° C., and 400° C. by respectively depositing Ti of 25 nm and Co of 12 nm on a substrate.

As shown in FIG. 3, $CoSi_2$ thin film and TiN thin film are formed when annealing temperature increases to 700° C., while CoTi film is formed when annealing temperature is below 700° C.

Figure 4A:
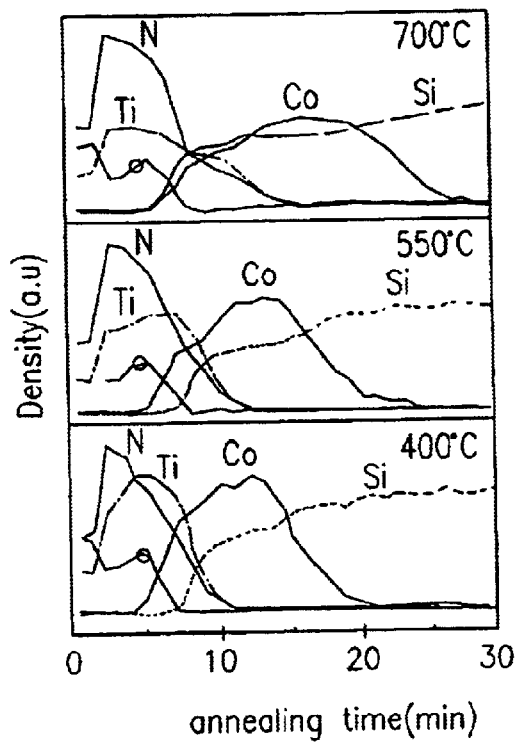
FIGS. 4a and 4b are profiles illustrating depths of thin films by auger electron spectroscopy (AEC) after rapid annealing for 60 seconds at each temperature by fixing Co thin film at 12 nm and depositing Ti thin films of 15 nm and 25 nm, respectively, on a semiconductor substrate.
Figure 4B:
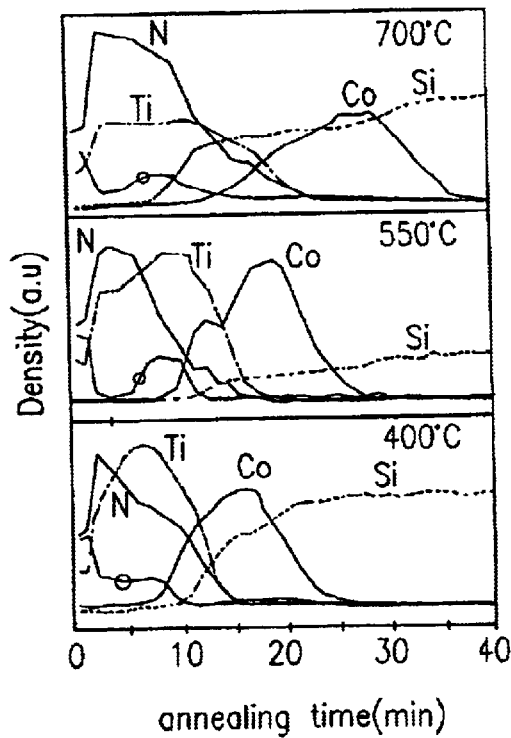

FIGS. 4a and 4b are profiles illustrating depths of thin films by AEC after rapid annealing for 60 seconds at each temperature by fixing Co thin film at, i.e., 12 nm and depositing Ti thin films of, e.g., 15 nm and 25 nm, respectively, on a semiconductor substrate.

As shown in FIGS. 4a and 4b, TiN layer is formed on a surface of the semiconductor substrate when annealing temperature is below 550° C. and Co—Si reaction occurs on the Si interface. Also, Co—Ti—Si mixing occurs when annealing temperature is 700° C. so that a ternary phase thin film is formed. The ternary phase thin film more clearly appears as the thickness of Ti increases.

Figure 5A:
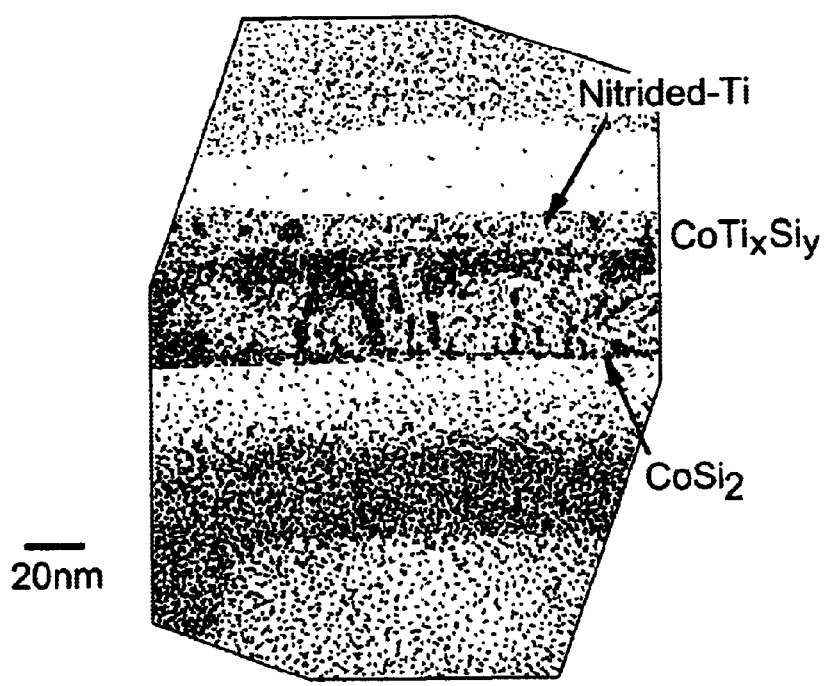
FIGS. 5a and 5b show TEM sectional photograph after rapid annealing for 60 seconds at 700° C. by depositing Ti thin films of 15 nm and 25 nm, respectively, on a semiconductor substrate.
Figure 5B:
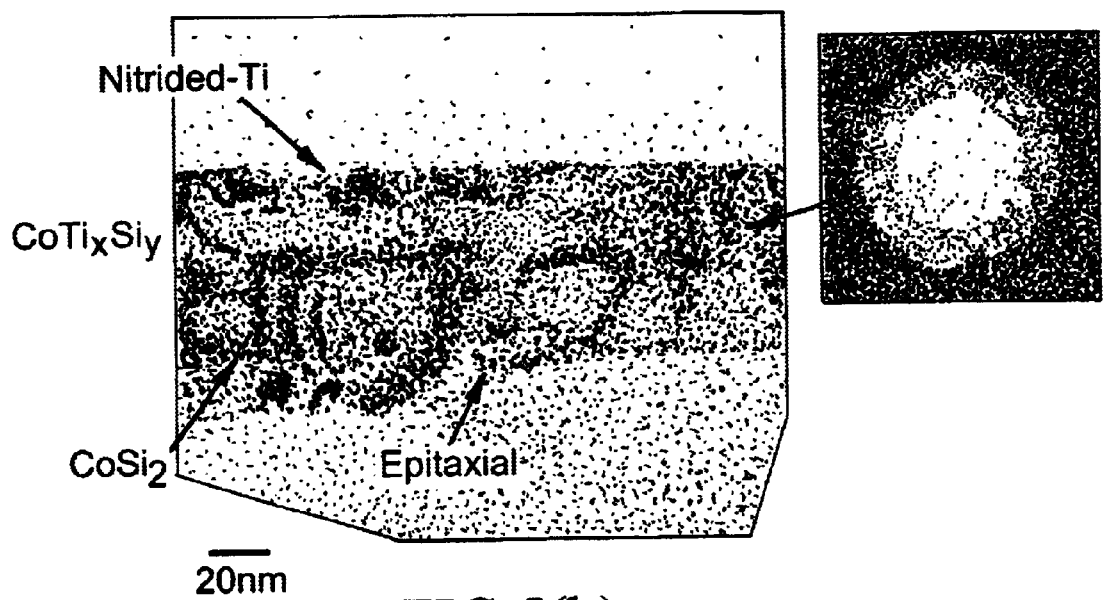

FIGS. 5a and 5b show TEM sectional photograph after rapid annealing for 60 seconds at 700° C. by depositing Ti thin films, e.g., of 15 nm and 25 nm, respectively, on a semiconductor substrate.

As shown in diffraction pattern of FIG. 5a, a ternary phase thin film (CoTixSiy) of amorphous structure is uniformly formed between cobalt silcide (CoSi) and the TiN thin film.

As shown in FIG. 5b, CoSi is epitaxially grown on the substrate and the substrate is uniformly formed.

According to the results as shown in FIG. 3 to FIG. 5, Ti thin film is capped on Si substrate and Co film is deposited. In this state, if annealing is performed at an appropriate temperature, stable CoSi film and a ternary phase thin film (CoTixSiy) of amorphous structure are formed. The ternary phase thin film prevents diffusion effectively.

The aforementioned method for manufacturing the semiconductor device has the following advantages.

First, since a silicide film of low resistance is formed, even at 700° C., it is possible to provide a good ohmic contact having low resistance.

Second, since Co does not easily react with dopants such as P, As and B, dopant loss is minimized on the interface between the CoSi film and the substrate. This prevents differences in electrical characteristic between N and P type substrates from occurring.

Third, since the CoSi film is thermally stable even at temperatures of 900° C. or more, the surface of the CoSi film is uniform and it is possible to enhance the thermal properties.

Fourth, a Co—Ti—Si ternary phase thin film having excellent diffusion prevention characteristics is formed in the contact region between the Co film and the Ti film.

Fifth, since Ti film is capped on Si substrate to uniformly form the epitaxial CoSi film, it is possible to avoid poor contact, thereby obtaining stable ohmic contact and improving leakage current characteristic. Finally, since the ternary phase thin film is self-aligned between Co film and Ti film in a portion where silicon is exposed, the ternary phase thin film is uniform and it can be reliably reproduced.

It will be apparent to those skilled in the art that various modifications and variations can be made in the method for manufacturing a semiconductor device according to the present invention without departing from the spirit or scope of the invention. Thus, it is intended that the present invention covers the modifications and variations of the invention provided they come within the scope of the appended claims and their equivalents.

What is claimed is:

1. A method for manufacturing a semiconductor device comprising:
    sequentially forming an insulating film on a semiconductor substrate and depositing a photoresist layer on the insulating film;
    patterning the photoresist layer to form a contact region in the center of the substrate;
    selectively removing the insulating film to expose a portion of the substrate in said contact region and forming a contact hole in said contact region;
    sequentially forming a first refractory metal and a second refractory metal on a surface of the semiconductor substrate;
    forming a silicide film beneath the contact hole at an interface between the semiconductor substrate and the first refractory metal; and
    reacting the semiconductor substrate with the first and second refractory metals on the silicide film to form a ternary phase thin film beneath the contact hole.

2. The method for manufacturing a semiconductor device as claimed in claim 1, wherein the first refractory metal is formed of cobalt.

3. The semiconductor device as claimed in claim 1, wherein the second refractory metal is formed from one of Ti, TiN, Ta, W, V, Cr, Mn, Zr, Mo and Hf.

4. The method for manufacturing a semiconductor device as claimed in claim 1, wherein the silicide film and the ternary phase thin film are formed at the same time.

5. The method for manufacturing a semiconductor device as claimed in claim 1, wherein the silicide film and the ternary phase thin film are formed by performing annealing process in the semiconductor substrate in which the first and second refractory metals are formed.

6. The method for manufacturing a semiconductor device as claimed in claim 3, wherein the annealing process is performed at about 700° C. or more.

7. The method for manufacturing a semiconductor device as claimed in claim 3, wherein the annealing process is performed in a nitrogen atmosphere.

8. The method for manufacturing a semiconductor device as claimed in claim 1, wherein the suicide film is epitaxially formed.

9. A method for manufacturing a semiconductor device comprising:
    forming an insulating film on a semiconductor substrate;
    selectively removing the insulating film to partially expose a surface of the semiconductor substrate so that a contact hole is formed;
    sequentially forming a first refractory metal and a second refractory metal on an entire surface of the semiconductor substrate including the contact hole;
    forming a silicide film on an interface between the semiconductor substrate of the contact hole region and the first refractory metal; and
    reacting the semiconductor substrate of the contact hole region with the first and second refractory metals to form a ternary phase thin film on the silicide film.

10. The method for manufacturing a semiconductor device as claimed in claim 9, wherein the insulating film is formed of an inorganic or organic material such as a CVD oxide film or a nitride film.

11. The method for manufacturing a semiconductor device as claimed in claim 8, wherein the first refractory metal is formed of cobalt.

12. The method for manufacturing a semiconductor device as claimed in claim 9, Wherein the second refractory metal is formed from one of Ti, TiN, Ta, W, V, Cr, Mn, Zr, Mo and Hf.

13. The method for manufacturing a semiconductor device as claimed in claim 9, further comprising the steps of forming a metal plug into the contact hole and forming a metal line on the metal plug.

14. The method for manufacturing a semiconductor device as claimed in claim 13, wherein the metal plug is formed of one or more alloys of W, Al, Cu, WSix, Mo, Cr, Ni, Pd, Pt and Ta.

15. The method for manufacturing a semiconductor device as claimed in claim 9, wherein the silicide film and the ternary phase thin film are formed at the same time by performing annealing process in the entire surface of the semiconductor substrate in a nitrogen atmosphere.

16. The method for manufacturing a semiconductor device as claimed in claim 15, wherein the annealing process is performed at about 700 C. or more.

17. The method for manufacturing a semiconductor device as claimed in claim 9, wherein the second refractory metal becomes a TiN film when forming the suicide film and the ternary phase thin film.

18. The method for manufacturing a semiconductor device as claimed in claim 9, wherein the silicide film is epitaxially formed.

19. A method to produce a semiconductor diffusion prevention device structure, comprising:
    forming a contact hole on a semiconductor substrate;
    forming first and second metal layers on the substrate and in the contact hole;
    forming a silicide layer beneath the contact hole and adjacent to the substrate; and
    forming a ternary phase layer on said silicide layer, said ternary phase layer being a Co—Ti—Si layer.

20. A method to produce a semiconductor device, comprising:
    forming an insulator film on a semiconductor substrate;
    forming a contact hole on said insulator film to expose said substrate;
    forming a silicide layer on said substrate and in said contact hole;
    forming a single layer diffusion prevention barrier on said silicide layer, said diffusion prevention layer being a ternary phase layer of Co—Ti—Si;

forming a conductive plug on said diffusion prevention layer in said contact hole; and forming a conducting layer on said plug.

21. A method to produce a semiconductor diffusion prevention device, comprising:

forming a contact hole on a semiconductor substrate;

forming a first metal layer on the substrate, and in the contact hole;

forming a second metal layer on said first metal layer; and annealing said first and second metal layers to form a silicide layer beneath the contact hole, and a ternary phase layer on said silicide layer, said ternary phase layer being a Co—Ti—Si layer.

22. A method to produce a semiconductor diffusion prevention device structure, comprising:

forming a contact hole on a semiconductor substrate;

forming first and second metal layers on the substrate and in the contact hole;

forming a silicide layer beneath the contact hole at an inner face between the substrate and the first metal layer; and reacting the substrate with the first and second metal layers to form a ternary phase layer on said silicide layer.

* * * * *

UNITED STATES PATENT AND TRADEMARK OFFICE
CERTIFICATE OF CORRECTION

PATENT NO. : 6,649,520 B1 Page 1 of 1
APPLICATION NO. : 09/461767
DATED : November 18, 2003
INVENTOR(S) : Dong K. Sohn et al.

It is certified that error appears in the above-identified patent and that said Letters Patent is hereby corrected as shown below:

In the specification:

In column 1, line 44, please change "suicide" to --silicide--;
In column 2, line 10, please change "suicide" to --silicide--; and
In column 4, line 49, please change "silcide" to --silicide--.

In the claims:

In claim 8, line 2, please change "suicide" to --silicide--; and
In claim 17, line 3, please change "suicide" to --silicide--.

Signed and Sealed this

Second Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 6,649,520 B1  Page 1 of 1
APPLICATION NO. : 09/461767
DATED : November 18, 2003
INVENTOR(S) : Dong K. Sohn et al.

It is certified that error appears in the above-identified patent and that said Letters Patent is hereby corrected as shown below:

In the specification:

In column 1, line 44, please change "suicide" to --silicide--;
In column 2, line 10, please change "suicide" to --silicide--; and
In column 4, line 49, please change "silcide" to --silicide--.

In the claims:

Column 5, in claim 8, line 64, please change "suicide" to --silicide--; and
Column 6, in claim 17, line 44, please change "suicide" to --silicide--.

This certificate supersedes the Certificate of Correction issued December 2, 2008.

Signed and Sealed this

Twentieth Day of January, 2009

JON W. DUDAS
*Director of the United States Patent and Trademark Office*